United States Patent
Penzes

(10) Patent No.: US 9,007,095 B2
(45) Date of Patent: Apr. 14, 2015

(54) EFFICIENT NON-INTEGRAL MULTI-HEIGHT STANDARD CELL PLACEMENT

(75) Inventor: Paul Penzes, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 111 days.

(21) Appl. No.: 13/467,275

(22) Filed: May 9, 2012

(65) Prior Publication Data

US 2013/0214433 A1  Aug. 22, 2013

Related U.S. Application Data

(60) Provisional application No. 61/600,303, filed on Feb. 17, 2012.

(51) Int. Cl.
| | |
|---|---|
| H01L 25/00 | (2006.01) |
| G06F 17/50 | (2006.01) |
| H01L 27/02 | (2006.01) |
| H01L 27/118 | (2006.01) |
| H01L 23/528 | (2006.01) |

(52) U.S. Cl.
CPC ......... *G06F 17/5072* (2013.01); *H01L 23/5286* (2013.01); *H01L 27/0207* (2013.01); *H01L 27/11807* (2013.01); *H01L 2924/00* (2013.01); *H01L 2924/0002* (2013.01)

(58) Field of Classification Search
USPC ......... 326/37–41, 47, 101; 716/118–121, 126
See application file for complete search history.

(56) References Cited

U.S. PATENT DOCUMENTS

2010/0162187 A1* 6/2010 Penzes et al. .................. 716/2

* cited by examiner

*Primary Examiner* — Thienvu Tran
(74) *Attorney, Agent, or Firm* — Sterne, Kessler, Goldstein & Fox P.L.L.C.

(57) ABSTRACT

An integrated circuit including a first portion of a first cell library including a first plurality of rows, each of the first plurality of rows having a first row height and the first portion having a first portion height, a second portion of a second cell library including a second plurality of rows, each of the second plurality of rows having a second row height and the second portion having a second portion height, wherein the first portion height is equal to the second portion height and the first row height is different from the second row height, and a connector to electrically connect the first portion of the first cell library to the second portion of the second cell library.

25 Claims, 7 Drawing Sheets

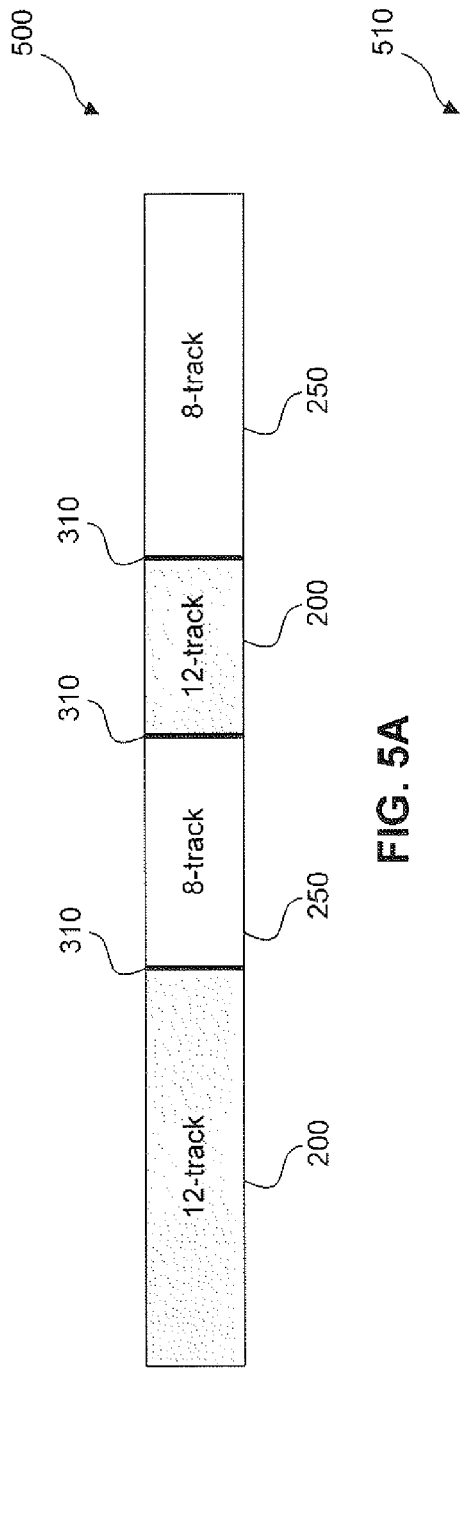
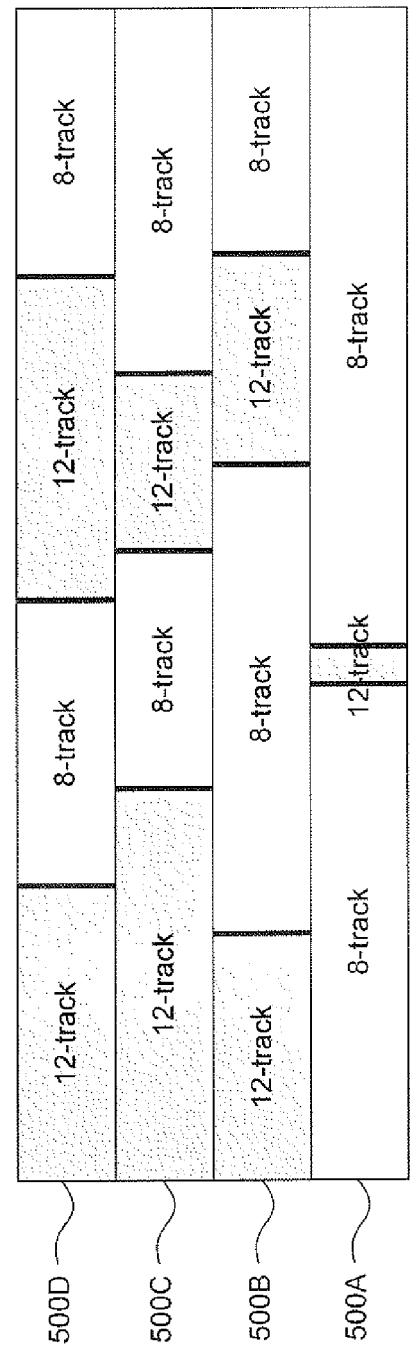

EFFICIENT NON-INTEGRAL MULTI-HEIGHT STANDARD CELL PLACEMENT

CROSS REFERENCE TO RELATED APPLICATION

This application claims the benefit of U.S. Provisional Application No. 61/600,303, filed Feb. 17, 2012, the contents of which are incorporated herein by reference in its entirety.

FIELD OF THE INVENTION

The present application is directed to customized configurations of cell libraries for a given block of an integrated circuit (IC). These configurations enable efficient use of the area on the IC and also improve the power consumption characteristics of the IC.

BACKGROUND

As discussed in further detail below, conventional configurations of cell libraries for an integrated circuit are undesirable because they do not allow customization of the cell libraries within a given circuit block of an integrated circuit (IC). Therefore, conventional configurations of cell libraries do not enable efficient use of the area on the IC and do not improve power consumption characteristics of the IC.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIG. 5A illustrates a portion of a circuit block combining of multiple portions 200 of a 12-track cell library with multiple portions 250 of the 8-track cell library according to an embodiment of the present disclosure.

FIG. 5B illustrates the exemplary circuit block stacking of combinations of 8-track cell library devices and 12-track cell library devices according to an embodiment of the present disclosure.

DETAILED DESCRIPTION

In the following description, numerous specific details are set forth in order to provide a thorough understanding of the disclosure. However, it will be apparent to those skilled in the art that the disclosure including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 7:
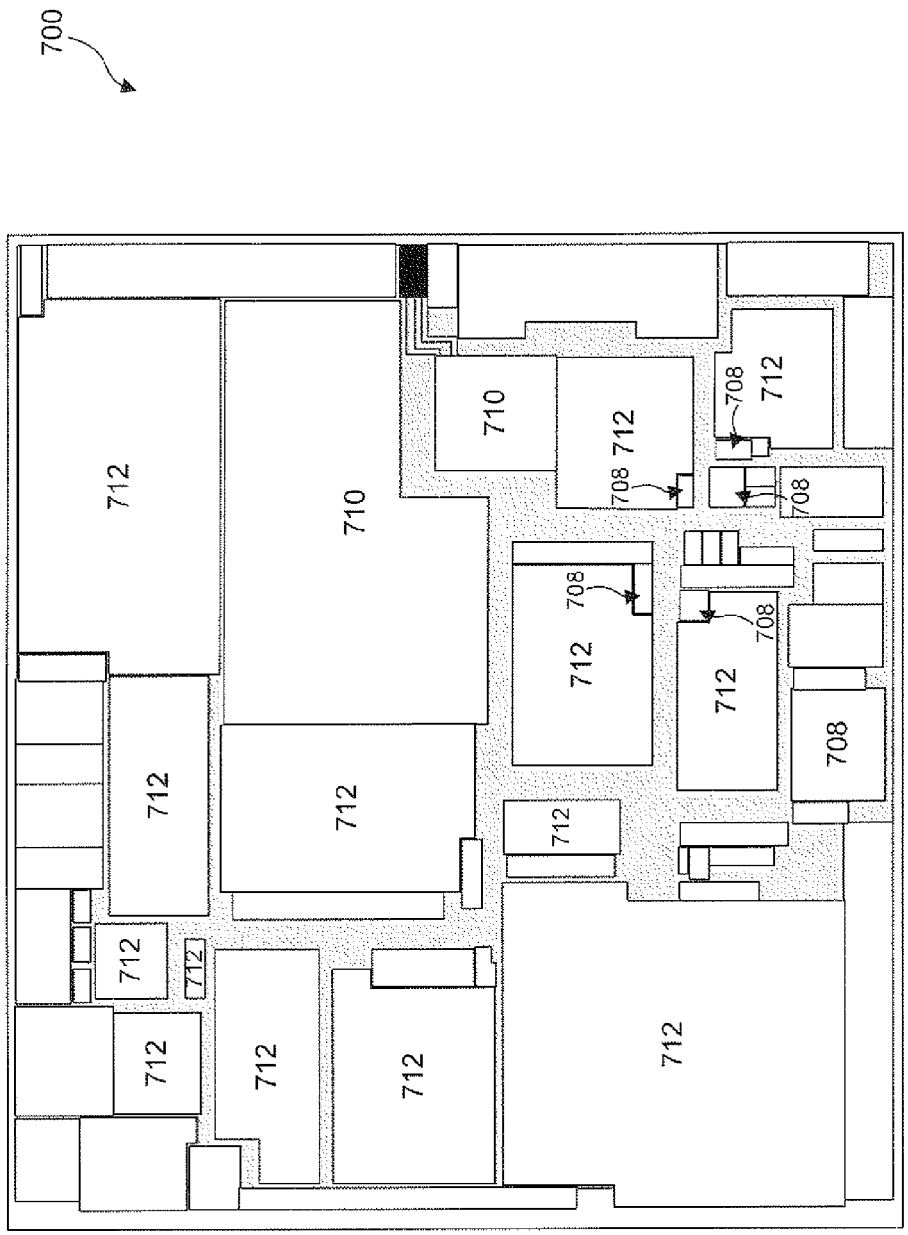
FIG. 7 illustrates a conventional chip 700 including blocks implemented using conventional designs/configurations.

FIG. 7 illustrates a conventional integrated circuit (IC) using, for example, 40 nm or 28 nm fabrication processes. The IC 700 includes various circuit blocks 708, 710, 712 configured from standard "cells" chosen from respective cell libraries that are implemented using conventional configurations. A cell or group of cells, in a circuit block performs a specific electrical or logic function that is to be performed by, or within the circuit block. Examples include various logic gates (AND, OR, NOR, XOR, etc.) that can be selected by a designer to construct the more complicated functionality of the overall circuit block. Some of the more common cell libraries used in the conventional ICs are the 8-track cell library, the 9-track cell library, the 10-track cell library, and the 12-track cell library. In IC 700, circuit block 708 includes the 8-track cell library, block 710 includes the 10-track cell library, and block 712 includes the 12-track cell library.

Cell libraries can be categorized based on the area, power, and speed characteristics of their corresponding standard (circuit) cells. For example, a 10-track standard cell is 25% larger than an 8-track standard cell and consumes proportionally more power than the 8-track standard cell. The 12-track standard cell is 50% larger than the 8-track standard cell and also consumes proportionally more power than the 8-track standard cell. Herein, "n-track" refers to the number of adjacent wires that can safely fit in a standard row of the corresponding cell library, and therefore represents a relative size of cells in a particular cell library. Further, the 10-track standard cell is about 15% faster than the 8-track standard cell and the 12-track standard cell is about 30% faster than the 8-track standard cell. For the above reasons, the 8-track library (which requires less area/power on an IC) is desirable for slow-speed applications, and the 12-track library (which requires more area/power on a IC) is desirable for high-speed applications like a central processing unit (CPU) core or a double data rate (DDR) interface logic, where the speed of the 12-track cell library is necessary to meet performance requirements. The 10-track library may be desirable for medium-speed applications.

Generally, a given circuit block of the IC is required to support both, the slow-speed applications and the high-speed applications. Therefore, it would be desirable to select cells from a first cell library (e.g., the 8-track cell library) within the given block to support the slow-speed applications, and to select cells from a second cell library (e.g. the 12-track cell library) within the given block to support the high-speed applications. However, using conventional cell libraries, a designer is restricted to selecting cells from only one cell library in the entirety of a given circuit block of the IC.

Therefore, circuit blocks 708 include cells selected from only the 8-track cell library, circuit blocks 710 include cells selected from only the 10-track cell library, and circuit blocks 712 include cells from only the 12-track cell library.

More specifically, the conventional configurations preclude standard cells from different cell libraries from being selected to be combined within a given circuit block of the IC. This is due to the physical size differences of the respective standard cells in the respective cell libraries. That is, the size differences of the respective standard cells manifest as different row heights in the different cell libraries, as discussed below in further detail. This height difference prevents the selection and placement of standard cells from different cell libraries in the same given block of the IC. Therefore, a designer is forced to select all the cells from a faster cell library for a given circuit block, even if only a few of the functions performed by the circuit block support high-speed applications and the majority of the functions support low-speed applications. For example, a designer is forced to select all cells from a 12-track cell library to implement a given block even when only a few functions performed by the block require the high-speed performance provided by standard cells of the 12-track cell library. This limitation is undesirable because of the larger area and power requirements of the 12-track cell library. Therefore, the configurations of conventional cell libraries are not optimal because they increase IC substrate area, and also unnecessarily increase the power consumption.

The present disclosure describes configurations that enable the combination of cells from cell libraries of differing size to be used in the same circuit block of an IC chip. In particular, the present disclosure provides techniques to form a single circuit block including first-type cells selected from a small size and low power cell track library (e.g., 8-track library) to support low-speed applications, and including second-type cells selected from a larger size and higher power cell track library (e.g., 10-track library or 12-track library) to support medium-speed or high-speed applications. Therefore, the configurations of the present disclosure enable an efficient use of the substrate area of the IC and also improve (i.e. reduce) the power consumption characteristics of the IC. Some additional improvements include a smaller overall size of the IC, lower manufacturing cost of the IC, and improved reliability of the IC due to reduced leakage current.

An exemplary structure of a cell library will now be discussed for a better understanding of the present disclosure. A given cell library can be described as including a number of horizontal rows of cells stacked on top of each other. Each row can be formed by two consecutive voltage rails, namely a VSS (ground) rail and a VDD (power) rail. The space between the VSS rail and the VDD rail defines a cell height of the row. The height is the same for each of the number of rows for a given cell library. For example, the horizontal space between a first VSS rail and a first VDD rail can be defined as a first row of the cell library, the horizontal space between the first VDD rail and a second VSS rail can be defined as a second row of the cell library, and so on. Each row of a cell library can include one or more standard cells having a height equal to the height of the row and having an appropriate width that allows the standard cell to perform a designated electrical function within a circuit block (e.g. logic function such as AND, OR, etc.). As discussed above, the row height may be quantified as the number of adjacent wire pairs (called "tracks") that can safely fit in a standard row of the corresponding cell library.

Figure 1:
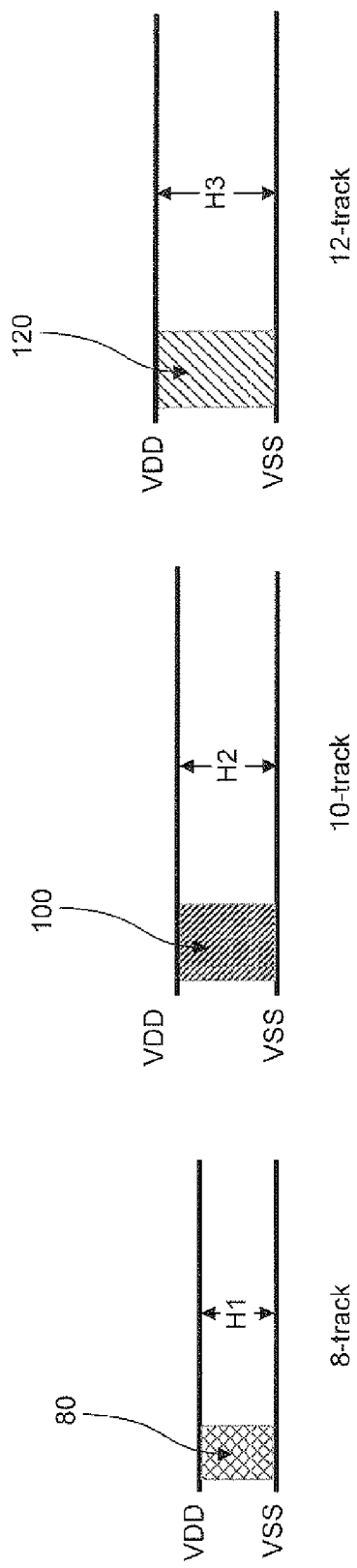
FIG. 1 illustrates a row (from among the number of rows) included in each of an 8-track cell library, the 10-track cell library, and the 12-track cell library.

FIG. 1 illustrates a row (from among the number of rows) included in each of the 8-track cell library, the 10-track cell library, and the 12-track cell library. As seen from FIG. 1, the height H1 of the row in the 8-track cell library is different from the height H2 of the row in the 10-track cell library, which is different from the height H3 of the row in the 12-track cell library. The difference between the row heights H1, H2, H3 reflects the difference in the sizes of the standard cells 80, 100, 120 respectively, included in the rows of the different cell libraries. This difference in the row heights H1, H2, H3 precludes the combination of rows from different cell libraries within a given block in conventional configurations.

Conversely, the present disclosure addresses the above need to combine portions (containing one or more cells) from different sized cell libraries in the same circuit block of an IC by: (a) calculating an appropriate number of rows to be included in respective portions of each of the two different sized cell libraries such that the total heights of each of the respective portions is the same, (b) forming combinations by electrically connecting each VSS rail in the respective portion of the first cell library with at least one VSS rail in a respective portion of the second cell library, and electrically connecting each VDD rail in the respective portion of the first cell library with at least one VDD rail in the respective portion of the second cell library, and (c) enabling the stacking of the above combinations on top of each other to implement the given circuit block.

Calculating an Appropriate Number of Rows for the Respective Portions

Figure 2:
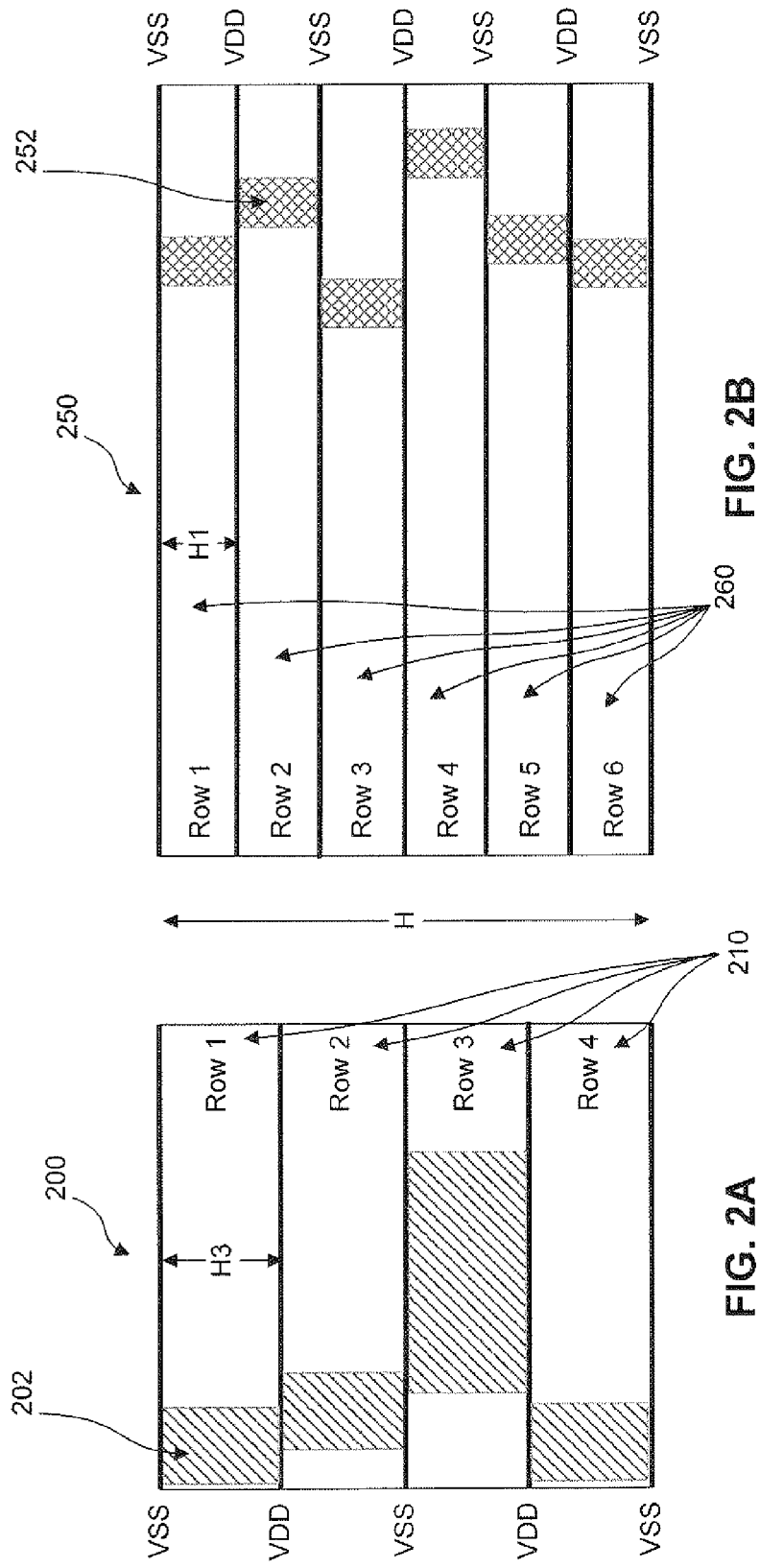
FIGS. 2A and 2B illustrate exemplary portions of different cell libraries according to an embodiment of the present disclosure.

FIGS. 2A and 2B illustrate portions of different cell libraries according to an embodiment of the present disclosure. In particular, FIG. 2A illustrates a portion 200 including four rows of the 12-track cell library and FIG. 2B illustrates a portion 250 including six rows of the 8-track cell library. Each row 210 of the 12-track cell library has a height H3 and includes a respective standard cell 202, and each row 260 of the 8-track cell library has a height H1 and includes a respective standard cell 252.

As seen from FIGS. 2A and 2B, the height H3 of each row 210 of the 12-track cell library is different from the height H1 of each row 260 of the 8-track cell library. However, the present disclosure enables the combination of portion 200 of the 12-track cell library with portion 250 of the 8-track cell library based on the realization that the total height H of portion 200 can be made approximately equal to the same total height H of portion 250, by correctly choosing the number of rows in each portion. In particular, to combine portions of two cell libraries in the same circuit block, the present disclosure calculates an appropriate number of rows to be included in respective portions of each of the two cell libraries such that the total heights of each of the respective portions is the same. For example, to combine portion 250 of the 8-track cell library with portion 200 of the 12-track cell library, the present disclosure calculates that six rows of the 8-track cell library should be included in portion 250 and that four rows of the 12-track cell library should be included in portion 200. Further, as discussed in detail below, the present disclosure contemplates the stacking of the combination of portions 200, 250 over other combinations of portions 200, 250. For this reason, it is desirable that the top-most power rail of each of the portions 200, 250 be of the same electrical polarity (e.g., VCC or VSS) as the bottom-most power rail of each of the portions 200, 250. Therefore, FIG. 2A illustrates portion 200 having the VSS rail as its top-most and bottom-most rail. Also, FIG. 2B illustrates portion 250 also having the VSS rail as its top-most and bottom-most rail.

The combination of portions 250, 200 of the 8-track cell library and the 12-cell track library, respectively, will now be discussed. An 8-track cell library has eight tracks and the 12-track cell library has twelve tracks. Tracks of a cell library could be defined as characteristic predefined routing guides that provide signal (interconnect) lines for passing electrical signals to and from the standard cells included in the cell library. To calculate the number of cell rows in the first and second portions from disparate cell libraries (e.g., 8-track and 12-track cell libraries), a least common multiple (LCM) of the number of tracks, eight and twelve, is computed. Further, to ensure that the VSS (or VDD) rail is the top rail and the bottom rail for each of the portions 200, 250, a number of tracks equal to twice the computed LCM are required. Finally, the number of rows for the 8-track cell library portion 250 is given by dividing the value of twice the computed LCM by eight, which is the number of tracks in the 8-track cell library. This equation is given by R8=[2*LCM(8, 12)]/8, where R8 represents the number of the 8-track rows in the 8-track portion of the circuit block, and LCM represents the least common multiple function. Similarly, the number of rows required for the 12-track cell library portion 200 is given by R12=[2*LCM(8, 12)]/12, where R12 represents the number of the 12-track plurality of rows in the 12-track portion of the circuit block, and LCM represents the least common multiple function. Solving the above equations, we get LCM(8, 12)=24, and 2*LCM(8, 12)=48. Therefore, the number of rows for the 8-track cell library portion 250=48/8=6, and the number of rows for the 12-track cell library portion 200=48/12=4. As such, the present disclosure derives that, to properly combine a first portion of 8-track cell library with a second portion of the 12-track cell library to form a circuit block, four rows of the 8-track cell library and six rows of the 12-track cell library are utilized.

Similarly, if the 9-track cell library is to be combined with the 12-track cell library, the calculation is carried out as LCM(9, 12)=36, and 2*LCM(9, 12)=72. Therefore, the number of rows for the 9-track cell library portion=72/9=8, and the number of rows for the 12-track cell library portion=72/12=6. As such, the present disclosure derives that, to properly combine a first portion of the 9-track cell library with a second portion of the 12-track cell library to form a circuit block, eight rows of the 9-track cell library and six rows of the 12-track cell library are utilized. It is to be noted that the above calculations are exemplary embodiments, and that the present disclosure contemplates the combination of different cell libraries having any number of tracks. In particular, a first portion of a first cell library having N number of tracks can be combined with a second portion of a second cell library having M number of tracks. In this case, the number of rows for the first cell library portion=[2*LCM(N, M)]/N and the number of rows for the second cell library portion=[2*LCM(N, M)]/M.

Finally, even though the above exemplary embodiments discuss the combination of two different cell libraries, it is to be noted that combining three or more different cell libraries is within the scope of the present disclosure using the above discussed calculation. It is also to be noted that widths of the portions 200, 250 can be arbitrarily selected to conform with speed/power/area requirements of the block of the integrated circuit. This will allow maximum flexibility for allocating logic in accordance with the speed/power/area requirements.

Electrically Connecting the Portions

Figure 3:
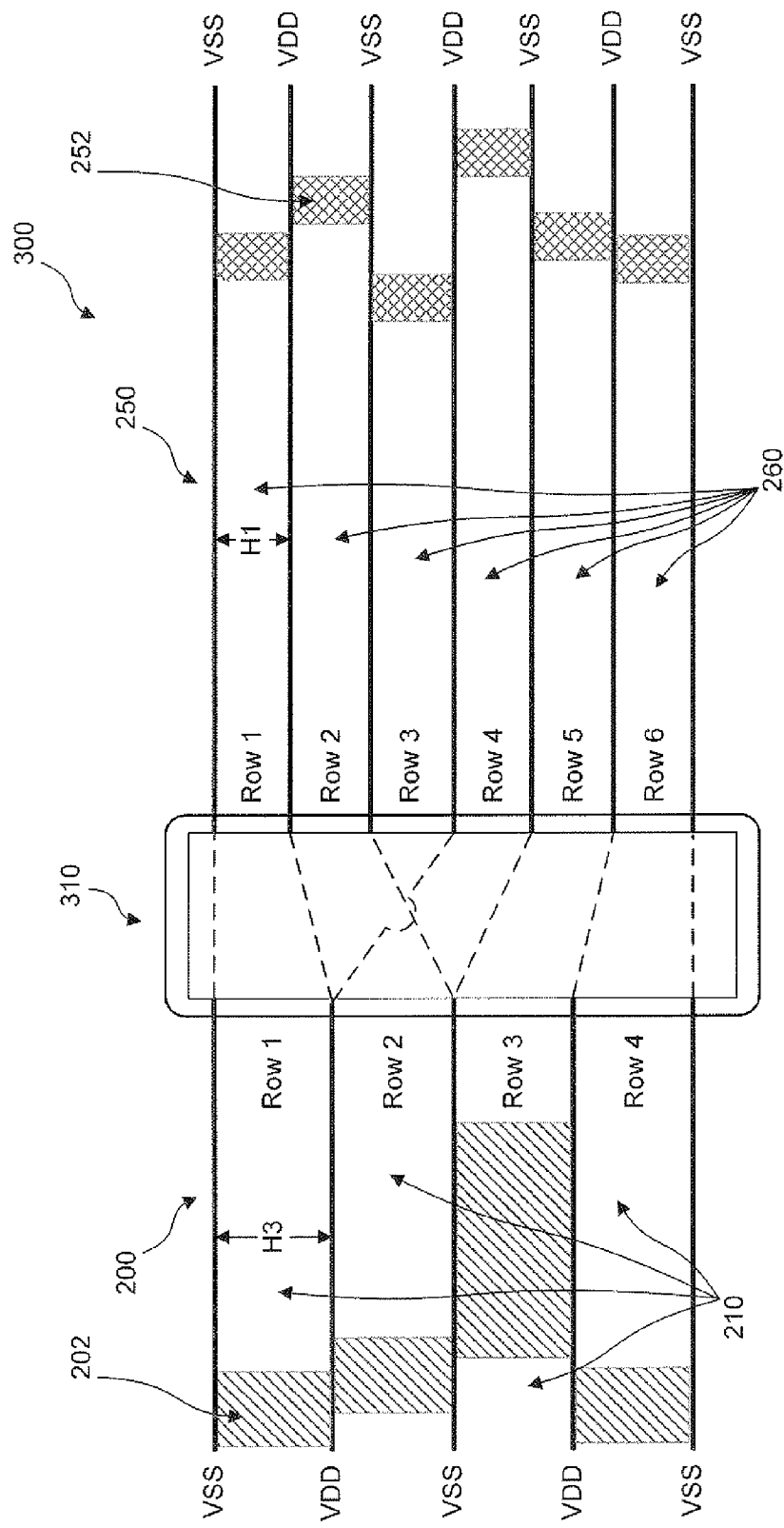
FIG. 3 illustrates an exemplary configuration 300 according to an embodiment of the present disclosure.

Once the number of rows for each of the portions has been calculated, the present disclosure contemplates a connector to electrically connect the two portions of the disparate cell libraries. To this end, FIG. 3 illustrates an exemplary configuration according to an embodiment of the present disclosure. In this embodiment, portion 200 including four rows of the 12-track cell library is combined with portion 250 including six rows of 8-track cell library to form a circuit block 300. The present disclosure uses connector 310 to electrically connect portion 200 with portion 250. As shown, the connector 310 electrically connects the VSS rail of Row 1 (top-most row) of the 12-track cell library to the VSS rail of Row 1 (top-most row) of the 8-track cell library, and electrically connects the VSS rail of Row 4 (bottom-most row) of the 12-track cell library to the VSS rail of Row 6 (bottom-most row) of the 8-track cell library. Further, the connector 310 electrically connects the VDD rails in the intermediate rows (Rows 2 and 3) of the 12-track cell library with the VDD rails in the intermediate rows (Rows 2-5) of the 8-track cell library. Finally, the connector 310 electrically connects the VSS rails in the intermediate rows (Rows 2 and 3) of the 12-track cell library with the VSS rails in the intermediate rows (Rows 2-5) of the 8-track cell library, for example, as shown in FIG. 3.

Figure 4:
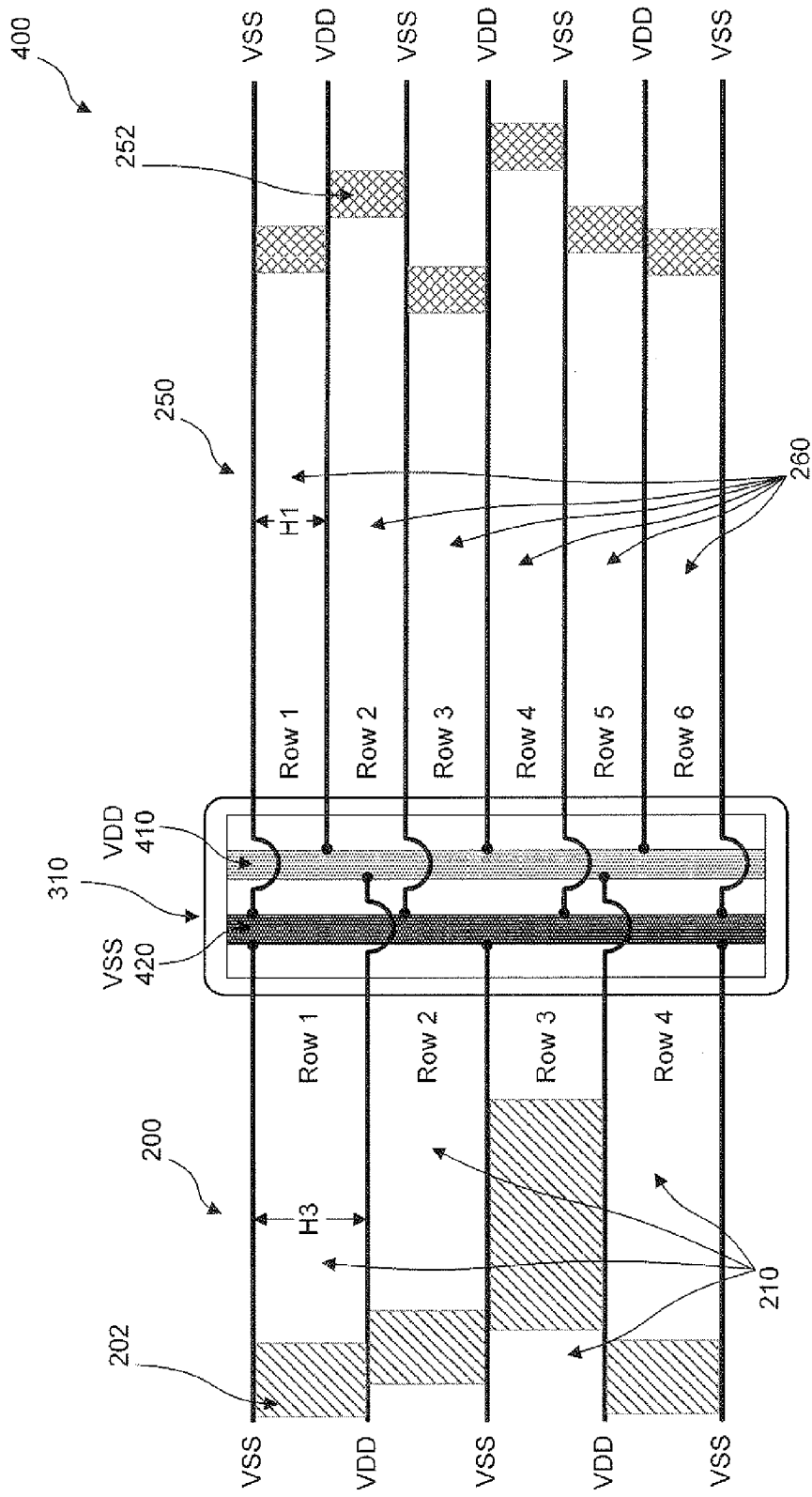
FIG. 4 illustrates another exemplary configuration 400 according to an embodiment of the present disclosure.

In this way, the present disclosure enables the combination of different cell libraries (e.g., 8-track, 12-track) to form the circuit block 300 that can be implemented in an IC. It is to be noted that the above connection configuration is exemplary, and that any configuration to electrically connect each VSS rail in a given portion of the 8-track cell library with at least one VSS rail in a given portion of the 12-track cell library, and to connect each VDD rail in the given portion of the 8-track cell library with at least one VDD rail in the given portion of the 12-track cell library, and vice versa, is within the scope of the present disclosure. For example, FIG. 4 illustrates another exemplary configuration 400 according to an embodiment of the present disclosure. In this configuration, the connector 310 electrically connects each VDD rail in portion 200 and each VDD rail in portion 250 to VDD bus 410 included in the chip. The connector 310 also electrically connects each VSS rail in portion 200 and each VSS rail in portion 250 to VSS bus 420 of the chip.

It is desirable to minimize the width of connector 310 in order to reduce any overhead added to the integrated circuit.

Combining and Stacking Portions in Various Configurations

FIG. 5A illustrates exemplary combining of multiple portions 200 of the 12-track cell library with multiple portions 250 of the 8-track cell library to form a circuit block according to an embodiment of the present disclosure. For example, based on a number of low-speed, medium-speed, and high-speed functions to be supported by the block, various sizes of portions 200 of the 12-track cell library may be combined with various sizes of multiple portions 250 of the 8-track cell library to create custom combinations 500. Accordingly, herein a "combination" includes one or more portions of a first-type cell library, and includes one or more portions of at least a second-type cell library, where the first and second type cell libraries having different track sizes as described above. As such, if a block is required to support a lot of low-speed applications and only a few high-speed applications, then a greater number of larger sized portions of the 8-track cell library could be combined with a fewer number of smaller sized portions of the 12-track cell library. For example, block 500A, which is, for example, utilized to support a lot of low-speed applications and only a few high-speed applications, is implemented utilizing a greater number of larger sized portions of the 8-track cell library and a fewer number of smaller sized portions of the 12-track cell library.

FIG. 5B illustrates the exemplary stacking of combinations 500A-D according to an embodiment of the present disclosure. For example, as illustrated in FIG. 5B, a second combination 500B can be stacked over a first combination 500A, which has a similar or different configuration with respect to the second combination 500B. For example, the second combination 500B may be stacked over the first combination 500A such that the bottom-most VSS rail of the second combination 500B overlaps (and electrically connects) the top-most VSS rail of the first combination 500A. In this embodiment, the stacked combination would include eight rows of the 12-track cell library in combination with twelve rows of the 8-track cell library. It is to be noted that the present disclosure contemplates the stacking of any number of combinations over one another in a given block of the chip.

Figure 6:
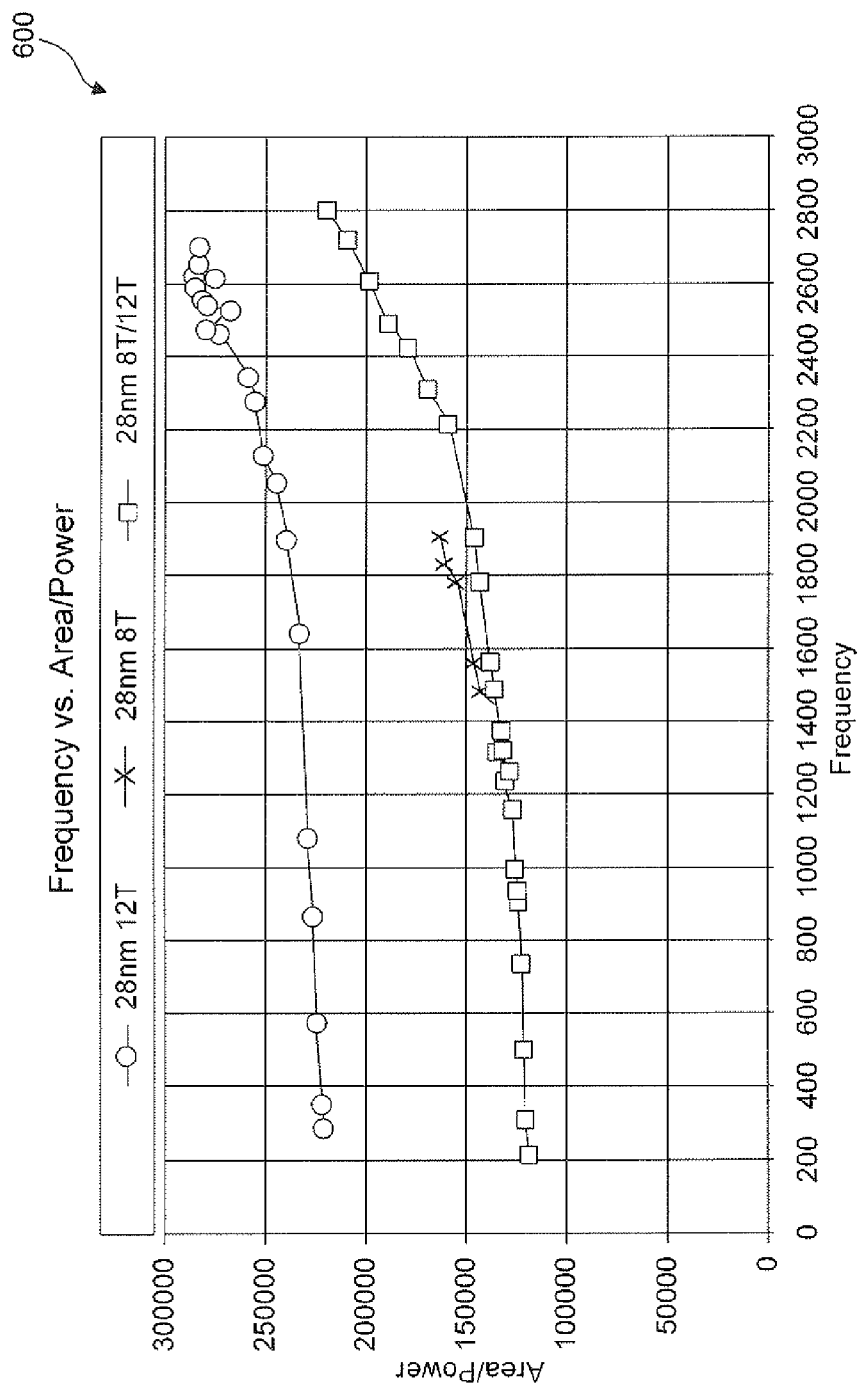
FIG. 6 illustrates an exemplary performance graph of a block implemented using a combination of two cell libraries according to an embodiment of the present disclosure.

FIG. 6 illustrates a performance graph 600 of a circuit block implemented using portions of two disparate cell libraries (e.g., 8-track cell library and 12-track cell library) in terms area/power and frequency. The goal is to meet the frequency requirement (x-axis) using the lowest area/power. The performance graph compares the hybrid block performance (8T/12T) with a block implemented using only the 8-track cell library (8T) and with a block implemented using only the 12-track cell library (12T). One can easily see that the block having the hybrid cell libraries preserves the area benefits provided by the 8-track cell library. In addition, the block having the combined cell libraries enables the high-speed performance provided by the 12-track cell library while using less area/power with respect to the block implemented using only the 12-track cell library.

The configurations proposed in the present disclosure are general and can be implemented using various commercially available computer-aided design (CAD) tools. From a practical point of view, the configurations of the present disclosure may require a new implementation of the placement algorithm used in these CAD tools. In modifying the CAD tool, the Place and Route (P&R) tool should made as flexible as possible. This flexibility may be reflected by the fine granularity with which cells of different track heights could be grouped together in a smooth way. The configurations in the present disclosure enable combining cell libraries including standard cells having height X (e.g., 8-track cell library) with cell libraries including standard cells having a height of 1.5× (e.g., 12-track cell library). Other combinations are possible without departing from the spirit and scope of the present disclosure. Another advantage of the configurations of the present disclosure is that conventional procedures including routing, extraction, timing analysis, of the circuit design process can possibly remain unchanged.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application

What is claimed is:

1. An integrated circuit, comprising:
a first portion of a first cell library including a first plurality of rows, each of the first plurality of rows having a first row height and the first portion having a first portion height;
a second portion of a second cell library including a second plurality of rows, each of the second plurality of rows having a second row height and the second portion having a second portion height, wherein the first portion height is equal to the second portion height and the first row height is different from the second row height; and
a connector configured to electrically connect the first portion of the first cell library to the second portion of the second cell library.

2. The integrated circuit of claim 1, wherein the first portion of the first cell library, the second portion of the second cell library, and the connector combine to form a block of the integrated circuit.

3. The integrated circuit of claim 1, wherein at least one of the first plurality of rows is configured to include a first standard cell of the first cell library, and at least one of the second plurality of rows is configured to include a second standard cell of the second cell library.

4. The integrated circuit of claim 3, wherein a first width of the first standard cell is greater than a second width of the second standard cell.

5. The integrated circuit of claim 1, wherein
each of the first plurality of rows is configured to include a first power rail and a first ground rail, and each of the second plurality of rows is configured to include a second power rail and a second ground rail, and
the connector is configured to electrically connect each first power rail with at least one second power rail, and to electrically connect each first ground rail with at least one second ground rail.

6. The integrated circuit of claim 5, wherein the connector is configured to electrically connect a top-most rail of the first portion to a top-most rail of the second portion, and to electrically connect a bottom-most rail of the first portion to a bottom-most rail of the second portion.

7. The integrated circuit of claim 5, wherein the connector is configured to connect each first power rail of the first portion and each second power rail of the second portion to a power bus included in the integrated circuit, and to connect each first ground rail of the first portion and each second ground rail of the second portion to a ground bus included in the integrated circuit.

8. The integrated circuit of claim 1, wherein a number of the first plurality of rows and a number of the second plurality of rows are calculated based on a least common multiple of a number of tracks associated with the first cell library and a number of tracks associated with the second cell library.

9. The integrated circuit of claim 1, wherein a number of the first plurality of rows included in the first portion is given by $$R=[2*LCM(N,M)]/N$$

where R represents the number of the first plurality of rows, N represents a number of tracks associated with the first cell library, M represents a number of tracks associated with the second cell library, and LCM represents a least common multiple function.

10. An integrated circuit, comprising:
a first portion of a first cell library including a first plurality of rows, each of the first plurality of rows having a first row height and the first portion having a first portion height;
a second portion of a second cell library including a second plurality of rows, each of the second plurality of rows having a second row height and the second portion having a second portion height, wherein the first portion height is equal to the second portion height and the first row height is different from the second row height; and
a connector configured to electrically connect the first portion of the first cell library to the second portion of the second cell library, wherein
the first portion of the first cell library, the second portion of the second cell library, and the connector form a combination, and
a bottom-most rail of a first combination is configured to be of the same polarity as a top-most rail of a second combination, the first combination being configured to be stacked on top of the second combination such that the bottom-most rail of the first combination overlaps the top-most rail of the second combination.

11. The integrated circuit of claim 10, wherein the first combination and the second combination form a block of the integrated circuit, the first combination being stacked on top of the second combination.

12. The integrated circuit of claim 10, wherein
each of the first plurality of rows is configured to include a first power rail and a first ground rail, and each of the second plurality of rows is configured to include a second power rail and a second ground rail, and
the connector is configured to electrically connect each first power rail with at least one second power rail, and to electrically connect each first ground rail with at least one second ground rail.

13. The integrated circuit of claim 12, wherein the connector is configured to connect each first power rail of the first portion and each second power rail of the second portion to a power bus included in the integrated circuit, and to connect each first ground rail of the first portion and each second ground rail of the second portion to a ground bus included in the integrated circuit.

14. The integrated circuit of claim 10, wherein a number of the first plurality of rows and a number of the second plurality of rows are calculated based on a least common multiple of a number of tracks associated with the first cell library and a number of tracks associated with the second cell library.

15. The integrated circuit of claim 10, wherein a number of the first plurality of rows included in the first portion is given by $$R=[2*LCM(N,M)]/N$$

where R represents the number of the first plurality of rows, N represents a number of tracks associated with the first cell library, M represents a number of tracks associated with the second cell library, and LCM represents a least common multiple function.

16. The integrated circuit of claim 10, wherein at least one of the first plurality of rows is configured to include a first standard cell of the first cell library, and at least one of the second plurality of rows is configured to include a second standard cell of the second cell library, a first width of the first standard cell being greater than a second width of the second standard cell.

17. An integrated circuit, comprising:
a first combination including,
a first portion of a first cell library including a first plurality of rows, each of the first plurality of rows having a first row height and the first portion having a first portion height;
a second portion of a second cell library including a second plurality of rows, each of the second plurality of rows having a second row height and the second portion having a second portion height, wherein the first portion height is equal to the second portion height and the first row height is different from the second row height; and
a first connector configured to electrically connect the first portion of the first cell library to the second portion of the second cell library; and
a second combination including,
a third portion of a third cell library including a third plurality of rows, each of the third plurality of rows having a third row height and the third portion having a third portion height;
a fourth portion of a fourth cell library including a fourth plurality of rows, each of the fourth plurality of rows having a fourth row height and the fourth portion having a fourth portion height, wherein the third portion height is equal to the fourth portion height and the third row height is different from the fourth row height; and
a second connector configured to electrically connect the third portion of the third cell library to the fourth portion of the fourth cell library, wherein
a bottom-most rail of the first combination is configured to be of the same polarity as a top-most rail of the second combination, the first combination being configured to be stacked on top of the second combination such that the bottom-most rail of the first combination overlaps the top-most rail of the second combination.

18. The integrated circuit of claim 17, wherein
each of the first plurality of rows is configured to include a first power rail and a first ground rail, and each of the second plurality of rows is configured to include a second power rail and a second ground rail, and
the first connector is configured to electrically connect each first power rail with at least one second power rail, and to electrically connect each first ground rail with at least one second ground rail.

19. The integrated circuit of claim 18, wherein a number of the first plurality of rows and a number of the second plurality of rows are calculated based on a least common multiple of a number of tracks associated with the first cell library and a number of tracks associated with the second cell library.

20. The integrated circuit of claim 17, wherein a number of the first plurality of rows included in the first portion is given by $$R = [2 * LCM(N,M)]/N$$

where R represents the number of the first plurality of rows, N represents a number of tracks associated with the first cell library, M represents a number of tracks associated with the second cell library, and LCM represents a least common multiple function.

21. The integrated circuit of claim 1, wherein a number of the first plurality of rows and a number of the second plurality of rows are determined so that the first portion height is equal to the second portion height.

22. The integrated circuit of claim 1, wherein the first portion and the second portion are immediately adjacent to one another and form a stacked row of a plurality of stacked rows that make up the integrated circuit.

23. An integrated circuit, comprising:
   a first circuit block portion formulated from a first cell library, the first circuit block portion including a first plurality of rows, each of the first plurality of rows having a plurality of cells from the first cell library arranged adjacent to one another and having a first row height;
   a second circuit block portion formulated from a second cell library, the second circuit block portion including a second plurality of rows, each of the second plurality of rows having a plurality of cells from the second cell library arranged adjacent to one another and having a second row height that is different from the first row height; and
   a connector configured to electrically connect the first circuit block portion to the second circuit block portion;
   wherein a number of the first plurality of rows and a number of the second plurality of rows are determined so that a height of the first circuit block portion is equal to a height of the second circuit block portion.

24. The integrated circuit of claim 23, wherein the number of the first plurality of rows and the number of the second plurality of rows are determined based on a least common multiple of a number of tracks associated with the first cell library and a number of tracks associated with the second cell library.

25. The integrated circuit of claim 23, wherein the first circuit block portion and the second circuit block portion are immediately adjacent to one another and form a circuit block in a stacked row of a plurality of stacked rows of circuit blocks that make up the integrated circuit.

* * * * *